United States Patent [19]

Grudkowski et al.

[11] 4,207,545
[45] Jun. 10, 1980

[54] LINEAR SAW SIGNAL PROCESSOR

[75] Inventors: Thomas W. Grudkowski; Gary K. Montress, both of Glastonbury, Conn.; Thomas M. Reeder, Portland, Oreg.

[73] Assignee: United Technologies Corporation, Hartford, Conn.

[21] Appl. No.: 936,984

[22] Filed: Aug. 25, 1978

[51] Int. Cl.$^2$ .................. H03H 9/26; H03H 9/32; H03H 9/30

[52] U.S. Cl. .................. 333/150; 333/166; 333/196; 364/821

[58] Field of Search .............. 333/166, 165, 150–154, 333/193–196; 364/821, 824; 310/313; 331/107 A; 330/5.5

[56] References Cited

U.S. PATENT DOCUMENTS

| | | | |
|---|---|---|---|
| 4,016,514 | 4/1977 | Reeder et al. | 333/150 |
| 4,024,480 | 5/1977 | Reeder et al. | 333/193 X |
| 4,070,638 | 1/1978 | Reeder | 364/821 X |
| 4,114,116 | 9/1978 | Reeder | 333/150 |

OTHER PUBLICATIONS

Morgan–"Efficiency of The Surface–Acoustic–Wave Diode Convolver" in IEEE Trans. on Electron Devices, vol. ed. 23, No. 6, Jun. 1976; pp. 573–579.

Primary Examiner—Alfred E. Smith
Assistant Examiner—Marvin Nussbaum
Attorney, Agent, or Firm—M. P. Williams

[57] ABSTRACT

Signals extracted from the taps of a surface acoustic wave (SAW) device, as a consequence of a single wave propogating therein or as a consequence of interaction between a pair of waves propagating therein, are processed by linearly-controlled nonlinear product mixing and/or amplifying devices, to provide output signals in a serial chain of chips of RF, the magnitude of chips being dependent upon unique, selected bias applied to corresponding ones of the devices. The devices may be diodes operating in a bias range to provide impedance greater than the capacitive reactance impedance of the taps to which they are attached, thereby providing a linear RF voltage to DC bias current characteristic, while at the same time providing a nonlinear DC voltage to DC current characteristic for RF product mixing (where used); or the devices may comprise transistors, either field effect or bipolar, with similar suitable bias considerations when linearly-controlled product mixing is desired. Applications, with or without output frequency isolation from input frequencies, include time division multiplexing of DC signals (such as transducer output signals), and transversal filtering, of the type useful in correlation or other wave or coded signal analysis.

10 Claims, 4 Drawing Figures

LINEAR SAW SIGNAL PROCESSOR

BACKGROUND OF THE INVENTION

1. Field of Art

This invention relates to surface acoustic wave signal processing, and more particularly to apparatus for linear surface acoustic wave signal processing.

2. Description of the Prior Art

In commonly owned U.S. Pat. No. 4,024,480 to Reeder and Grudkowski, a surface acoustic wave (SAW) signal processor utilizes frequency mixing diodes having direct amplitude and phase control to provide nonlinear frequency mixing, the amplitude of which is controllable by DC bias applied to the nonlinear diodes. One application described in said patent employs pre-programmed DC bias for the different taps to provide amplitude (as well as phase) correlation of the various chips (corresponding to related taps) of a phase shift keyed (PSK) signal train. Another application disclosed in said patent is multiplexing of DC signals representative of parameters such as time and temperature, by applying the DC signals to the respective nonlinear mixer circuits through the DC bias paths, to provide a sequence of RF signal chips, each chip having amplitude and/or phase indicative of the parameter represented by the DC signals. An additional application, discrete Fourier transform of a discrete coded signal, is shown in commonly owned U.S. Pat. Nos. 4,106,514 Reeder and Gilden and 4,114,116 to Reeder.

However, in all of these disclosed applications (and others) the operation is nonlinear with respect to the DC signals. As is common in the art, the diode bias is chosen for maximum mixer efficiency (mixer efficiency being the gain characteristic utilized in frequency mixing, SAW tap circuitry). In this operating regime, the RF voltage output varies inversely with the square of the DC bias current, such that the RF power output varies inversely with the fourth power of the DC input signal. In use of such devices for correlation, the pre-programmed biases may, of course, be suitably adjusted so as to accommodate the inverse square mixer efficiency. And, when using such circuitry for analysis or multiplexing of parameter-related DC signals, it is possible to accommodate nonlinear outputs by means of conversion circuitry or the like. However, these functions become much simpler, and more easily adapted to limited space, controlled-weight environments and the like, when linearity (between RF output and DC bias) is inherently provided. Further, the cost and complexity of design and maintenance of such equipment is naturally reduced significantly if inherent linear operation is utilized.

SUMMARY OF THE INVENTION

Objects of the invention include provisions of SAW signal processing, such as SAW multiplexing and SAW transversal filtering, having linear relationships between RF output voltages and tap biases.

According to the present invention, a plurality of taps of a SAW delay line are each connected to a corresponding electronic device having a linear RF output voltage to DC bias current relationship, to provide corresponding output signal trains of RF signal chips, the amplitude of which is linearly related to a DC signal corresponding to the related tap and used for biasing the one of said devices associated therewith. In further accord with the invention, the devices provide the nonlinear DC voltage to DC bias current characteristic necessary for RF product mixing (whereby output signals may be produced with carrier frequencies isolated from the input signal frequencies) concurrently with a linear output frequency amplitude relationship to the DC signals used for biasing the corresponding devices. In still further accord with the present invention, the devices may comprise either bipolar or field effect transistors. In accordance further with the present invention, the devices may comprise diodes biased to limit the DC current to that which provides diode impedance greater than the capacitive reactance impedence of the SAW tap to which it is connected. In accordance still further with the present invention, the apparatus may comprise SAW devices capable of propagating a single wave, in which case a linear amplification characteristic of the devices is employed, or in connection with SAWs at two frequencies, in which case the linear control of the efficiency of the nonlinear product mixing characteristic is employed, to process the signals and provide useful, linearly related outputs.

The invention provides a vast array of possibilities in SAW signal processing in which the RF amplitude of the output signals bears a linear relationship to the DC biases used for correlative type operations, or corresponding to input signals, the multiplexing of which into a signal train is desired.

Other objects, features and advantages of the present invention will become more apparent in the light of the following detailed description of exemplary embodiments thereof, as illustrated in the accompanying drawing.

DETAILED DESCRIPTION

Figure 1:
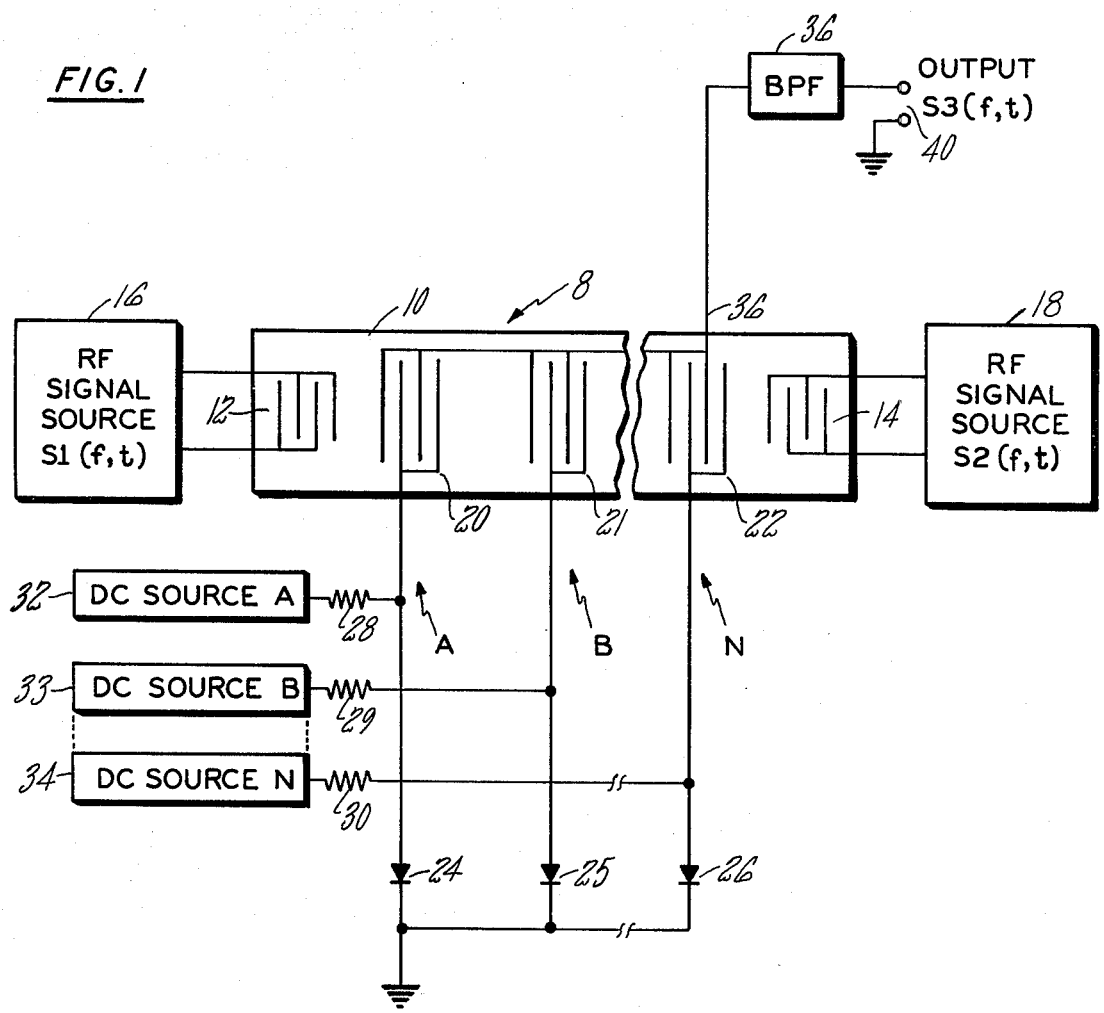
FIG. 1 is a schematic block diagram of a linearly-operated product mixing diode embodiment of the present invention.

Referring now to FIG. 1, a surface acoustic wave (SAW) device 8 includes a piezoelectric substrate 10 having a pair of transducers 12, 14 formed thereon for launching RF signals from first and second RF sources 16, 18 in a usual fashion. A plurality of taps A, B, ... N each comprise a tap transducer 20–22 for providing acoustoelectric coupling between the wave in the SAW and a corresponding device, such as linearly-operated diodes 24–26. Each of the diodes 24–26 is connected through a corresponding resistor 28–30 to a related DC source 32–34. One portion of each of the tap transducers 20–22 is commonly connected with the others by a line 36 through a band pass filter 38 to output terminals 40. This provides the filtered output ($f_3$, the sum or difference of $f_1$ and $f_2$) from the series combination of the filter and the transducer and diode of each tap, as is known.

As described with respect to similar, but more complex, nonlinear circuitry in the aforementioned Reeder and Grudkowski patent, the configuration of FIG. 1 may be utilized as a transversal filter, for instance, by causing the second RF signal source 18 to provide an RF carrier at a second frequency, the first RF signal source 16 to provide an amplitude modulated train or sequence of RF chips to be examined, and the sources 32-34 providing known, programmable voltages relating to corresponding attenuations. This provides a combined RF signal at the output terminals 40 at a third frequency, determined by the first and second frequencies and selected by the band pass filter 36. The output is a summation of individual chips, the amplitudes of which are indicative of matching the mixing efficiencies of the diodes 24-26, as a result of the DC biases provided by the sources 32-34, to the amplitude coding of the unknown input signal provided by the first RF signal source 16.

If the RF sources provide chirps, the apparatus will provide the discrete Fourier transform of a discretely coded signal applied by the DC sources, as in both the aforementioned Reeder and Gilden patent and Reeder patent.

Also according to the aforementioned Reeder and Grudkowski patent, the configuration of FIG. 1 may be utilized as a multiplexer to provide a signal train indicative of a variety of parameters which are desired to be known, voltages representing the parameters being respectively provided by the DC sources 32-34. In such case, the sources 32-34 may comprise DC signals derived from transducers such as temperature or pressure monitors or the like. For this type of operation, the second RF signal source 18 may again provide an RF carrier at a second frequency, the first RF signal source 16 is keyed to provide a pulse at a known frequency different from that of the signal source 18, the pulse being limited in its duration to be less than the propagation delay between the taps 20-22 of the SAW device 8. In such case, interaction of the pulse with the carrier wave occurs successively, one transducer after the other, so that each tap has successively provided to it superposed RF signals from the two sources, for product mixing in the corresponding one of the linearly-operated diodes 24-26. The output signal is at a third frequency (the sum or difference of the frequencies provided by the sources 16, 18, as is known) and includes successive chips in a sequence, each corresponding to a related tap, with an amplitude determined by the mixing efficiency of the corresponding ones of the diodes 24-26. This is determined by the DC bias current provided to the diodes, which in turn is a function of the voltage of the corresponding DC sources 32-34. Therefore the amplitude of each successive chip of the output corresponds to the magnitude of the related desired parameter as represented by the respective tap biases. This operation therefore provides time division multiplexing of a plurality of DC parameters, in the form of a sequence of RF chips, the amplitude of which represents the value of the parameter.

Figure 2:
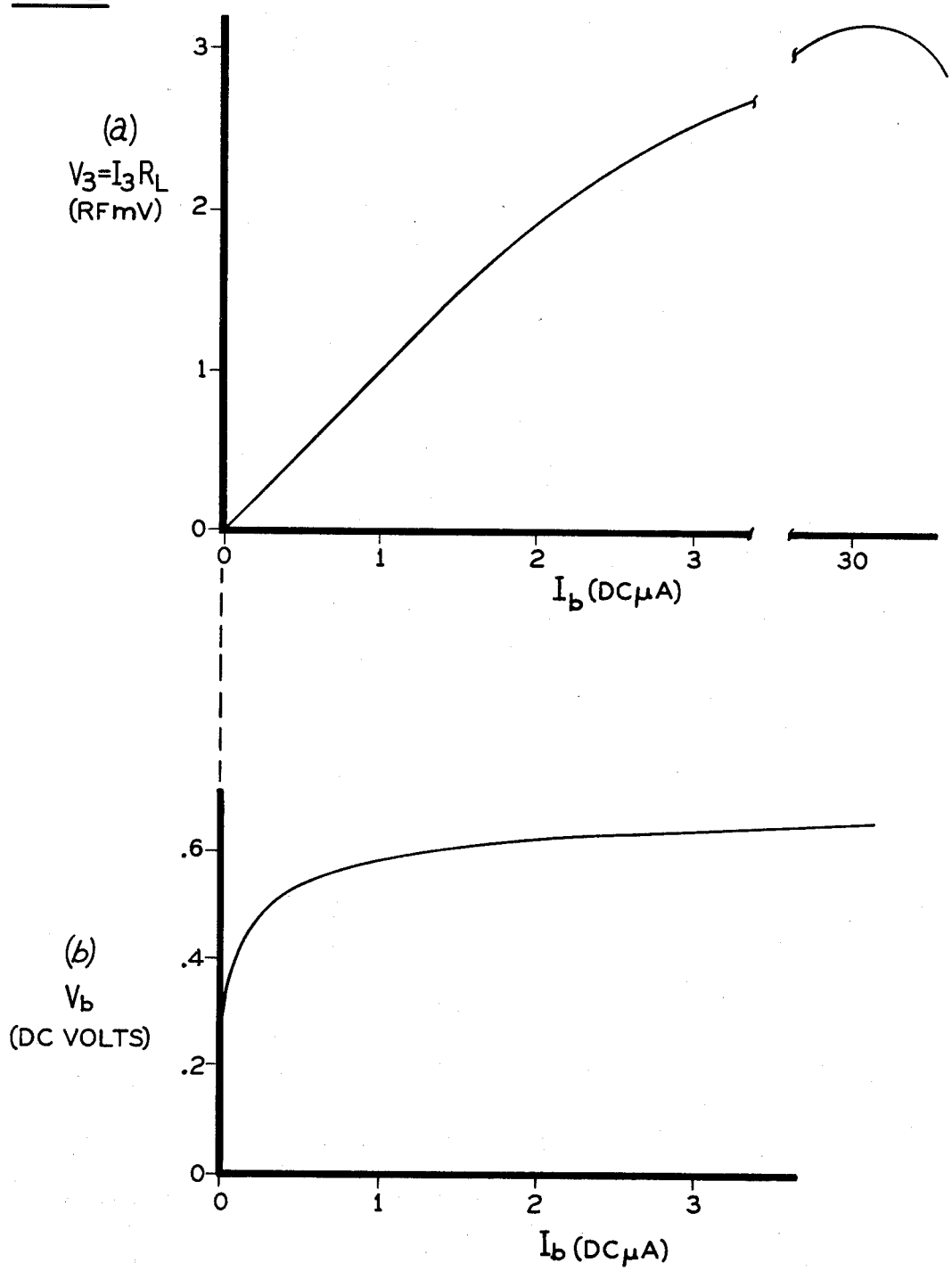
FIG. 2 is a comparative illustration of DC and RF response of the diodes in the embodiment of FIG. 1.

The foregoing description is generally applicable to the prior art, as generally represented by the aforementioned patents. In accordance with the invention, however, the diodes 24-26 are operated in a manner to provide a linear mixer efficiency. The amplitude of the RF output relates linearly to the magnitude of the DC bias, as is described more fully with respect to FIG. 2. In FIG. 2, illustration (a) shows the linear relationship of the RF output voltage amplitude (which is related to the RF current through the diode by the load thereon) as a function of the DC current through the diode. The DC current through the diode is, in turn, a function of the DC bias provided thereto by the sources 32-34 through the resistors 28-30. The fact that this linear relationship exists in diodes, while at the same time providing the nonlinear DC voltage across the diode as a function of DC diode current, shown in illustration (b) of FIG. 2, is an important aspect of the present invention.

It has been found that this linear relationship exists when the DC current through the diode is low enough to maintain the impedance of the diode at a level which is much greater than the capacitive reactance of the tap to which it is connected in SAW configurations. There is theoretical support for this empirically determined phenomenon. As set forth in relationships (1)-(4) of the Table of Relationships herein, the component of the RF output signal at the output terminals 40 provided by each of the taps is equal to the product of the mixer efficiency and the RF tap voltages. The mixer efficiency is in turn a function of the DC current through the diode and, from relationship (5), therefore a function of the diode impedance and is shown in relationship (6), which is further explained in relationships (7)-(10). This relationship becomes maximum when the diode impedance is about equal to the reactive impedance of the transducer taps, as is illustrated in relationships (11) and (12). However, when the diode current is much less than the diode current that provides it with a maximum mixer efficiency, the impedance of the diode is much greater than that for maximum efficiency, and therefore much larger than the capacitive reactance impedance of the associated SAW tap at the frequencies interacting thereat, as is set forth in relationship (13). In this situation, with effective load resistance small compared to diode impedance, rewriting of relationship (6) as set forth in relationship (14) (which ignores the reactive impedances and load resistance of relationship (6)) shows, in relationship (15), that the mixer efficiency is inversely proportional to the first power of the diode impedance and therefore is directly proportional to the first power of the diode DC current and therefore the diode DC bias voltage applied through suitable resistance, as expressed in relationship (16).

| Table of Relationships | |
|---|---|
| (1) | $V_1$ = RF input voltage (Source 16), at frequency $f_1$ |
| (2) | $V_2$ = RF input voltage (Source 18), at frequency $f_2$ |
| (3) | $V_3$ = RF output signal voltage at nth tap, at frequency $f_3$ |
| (4) | $V3_n = H_n(I_b)_n V_1 V_2$; $H_n(I_b)_n$ = mixer efficiency of diode for tap n as a function of diode current for tap n |
| (5) | $Z_b = K/I_b$, where $Z_b$ is impedance and $I_b$ = DC current for tap n |
| (6) | $H_n(I_b)_n \approx \dfrac{R_L}{2V_q} \dfrac{Z_b^2}{(Z_b + jX_1)(Z_b + jX_2)(Z_b + NR_L)}$ |
| (7) | where $Z_b$ = impedance of diode of tap n |
| (8) | $R_L$ = output load impedance |
| (9) | $V_q$ = diode thermal voltage = $kT/q$ |
|  | $X_1$ and $X_2$ = capacitive reactance of tap n at $f_1$ and $f_2$ |
| (10) | N = total number of taps |
| (11) | Let $I_B = I_b$ for $Z_b = Z_B \approx X_1, X_2$ (in magnitude) |
| (12) | then, $H_p(I_b)$ = maximum = $H_p(I_B)$ when $I_b = I_B$ so $Z_b = Z_B$ |
| (13) | For $I_b << I_B$, $Z_b >> Z_B$ and $Z_b >> X_1, X_2, NR_L$ |
| (14) | then $H_n(I_B) \approx \dfrac{R_L}{2V_q} \dfrac{Z_b^2}{(Z_b)(Z_b)(Z_b)}$ |
| (15) | so $H_n(I_B) \approx \dfrac{R_L}{2V_q} \dfrac{1}{Z_b}$ |
| (16) | and $H_n(I_B) \approx I_b \approx$ DC bias current (and thru resistance, voltage) |

The linear relationship between mixer efficiency, and therefore RF output voltage, and the DC bias current or voltage is in contrast with the prior art, in which the diodes are purposefully provided with much higher bias currents than that which would provide maximum efficiency (that is, where the diode impedence is approximately equal to the capacitive reactance of the tap at the frequencies interacting thereat). This is principally because the biases are in the milliamp regime, which is usually easier to handle than the microamp bias regime used herein. And, traditionally, nonlinear product mixing has involved FM or phase coding, instead of amplitude coding as used herein. The nonlinear diode voltage to diode current relationship referred to as DC herein for simplicity exists at all frequencies, including RF.

In the light of the teachings herein, utilization of the circuitry illustrated in FIG. 1, in accordance with the invention, to achieve RF output voltage amplitudes which vary linearly with DC tap voltages in a wide variety of applications, should be apparent from the teachings of the prior art, including the aforementioned patents. The nature and significance of one or both of the RF signals (pulse, CW carrier, chirp coded unknown), and the nature and significance of the voltage (or current) provided by the sources 32-34 (transducer output, filter tap weighting coefficients, discrete coded signal) are all commensurately related to the signal processing contemplated or being performed by the apparatus; this also applies to other embodiments.

Figure 3:
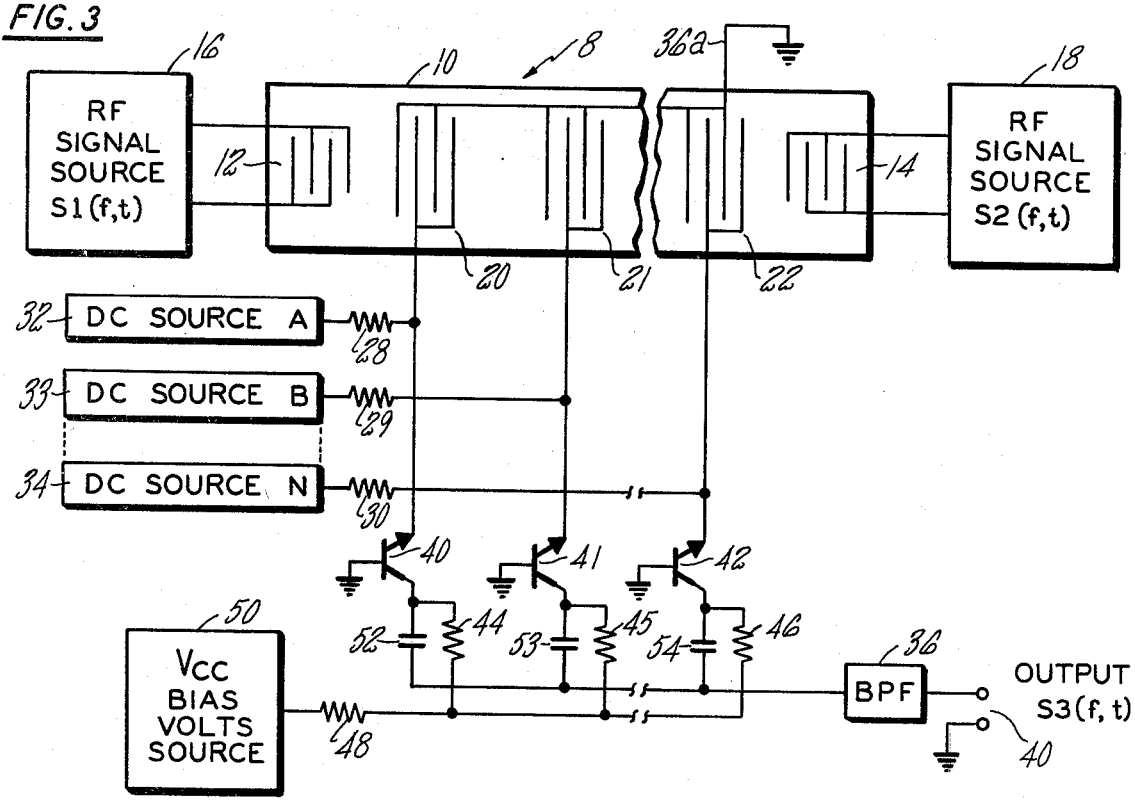
FIG. 3 is a schematic block diagram of a linearly-operated product mixing transistor embodiment of the present invention.

A second illustrative embodiment of the invention is set forth in FIG. 3, which is nearly identical to the embodiment of FIG. 2 except that the devices in accordance with the invention are linearly-operated transistors, rather than linearly-operated diodes. Specifically, the devices in FIG. 3 comprise a plurality of bipolar transistors 40-42 having corresponding bias resistors 44-46 connected through a resistor 48 to a collector-to-base bias voltage source 50. The resistors 44-46 also provide RF and DC isolation between the respective transistors 40-42. AC coupling between each of the transistors and the band pass filter 36 is provided by corresponding coupling capacitors 52-54. In FIG. 3, the common line 36a is grounded in contrast with the embodiment of FIG. 1. In other respects, the configuration of FIG. 3 is the same as FIG. 1, similar components thereof bearing the same reference numerals.

In FIG. 3, the DC sources 32-34 and their corresponding resistors 28-30 are adjusted to provide bias currents across the emitter-base diodes of the transistors for linear product mixing efficiency as described hereinbefore. This also affects the gain or amplification factor of the transistors 40-42. In the case of the transistors, however, the nonlinearity of the DC bias current vs DC voltage across the emitter base junction is capable of providing product mixing of superposed RF currents supplied to the emitters by the respective taps 20-22, while at the same time the collector RF voltage will be a linear function of the DC emitter current, in dependence upon the collector bias provided by the source 50. Thus, RF output voltage linearity is compatibly achieved with the DC diode voltage nonlinearity for product mixing, in the transistors 40-42 as well as in the diodes 24-26.

The utilizations of the circuitry shown in FIG. 3 are similar to those described with respect to FIG. 1 (and the aforementioned patents), hereinbefore.

Figure 4:
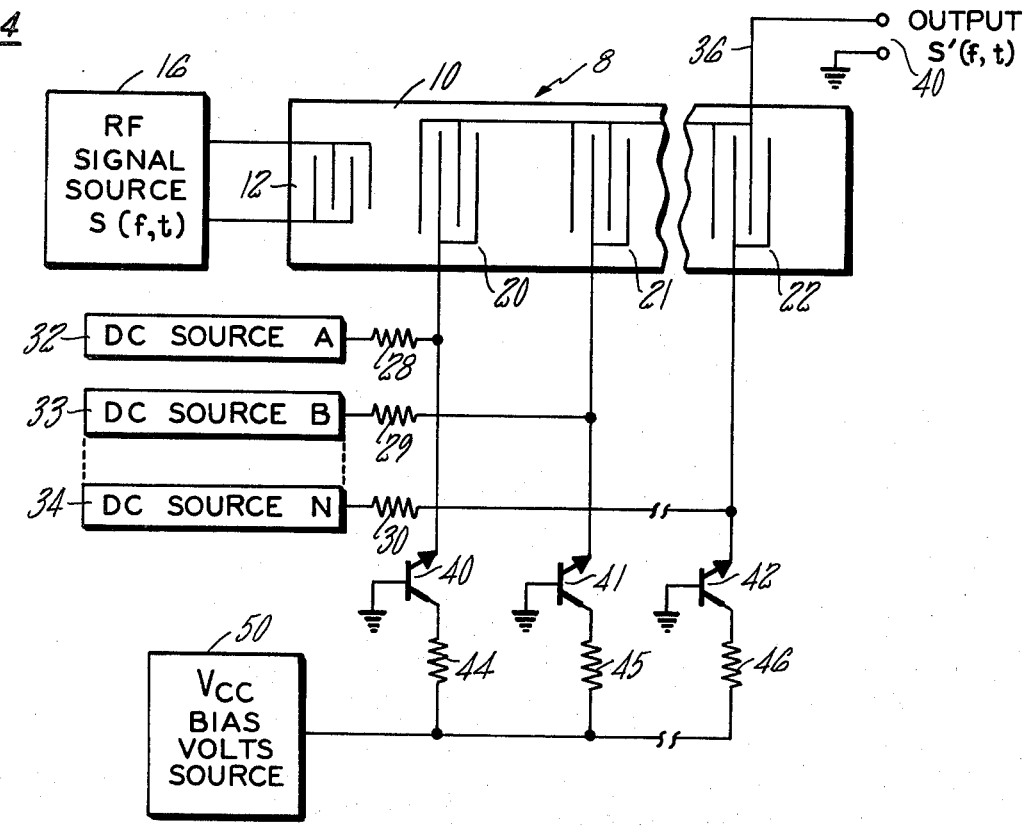
FIG. 4 is a schematic block diagram of a single frequency transistor amplifier embodiment of the present invention.

Referring now to FIG. 4, an embodiment of the invention which does not utilize product mixing of two RF signals is shown. In FIG. 4 only a single signal source 16 and corresponding launching transducer 12 are provided. One application of this circuit is in multiplexing the voltages represented by the DC sources 32-34 so as to provide a signal train at the output terminal 40, in which a sequence of chips at the frequency of the source 16 have amplitudes linearly dependent upon the voltage of the related sources 32-34. In this case, the transistors 40-42 (and associated bias circuitry) function as variable gain amplifiers, the gain of which is controlled by the emitter-base current, in turn dependent upon the voltage of the corresponding DC source 32-34. No product mixing is involved since only a single RF signal is used, it being an RF pulse of a duration less than the propagation delay time between the various taps 20-22, which pulse is amplified an amount determined by the DC voltages of the sources 32-34 associated with each respective tap. But, linear multiplexing is achieved by suitable parameter selection according to known techniques in the light of the teachings herein.

The circuitry of FIG. 4 may be utilized, in a fashion known in the art in the light of the teachings herein, to provide amplitude correlation of an RF signal provided by the source 16, which may comprise an amplitude coded signal, consisting of a sequence of chips having variable amplitudes indicative of the code represented thereby. In such case, the gains (sources 32-34) are adjusted suitably so as to provide a maximum output signal at the terminals 40 only in the case of complete correlation between the gains controlled by the sources 32-34 and the magnitude of the RF signal under each transducer 20-22 when the entire bit length (totality of the various chips) of the input RF signal is transversely disposed across the SAW device 8. This utilization of the linear relation of the invention is also in accordance with the teachings known in the prior art.

In FIGS. 3 and 4, the transistors 40-42 are depicted as bipolar transistors; however, the invention has been implemented with field effect transistors (FETs). Linear mixing (FIG. 3) is achieved by suitable biasing of the gate/source or gate/drain Schottky diodes, as described hereinbefore. But the linearity when mixing, or when amplifying in the non-mixing configuration of FIG. 4, is limited to a very small range, and therefore the FET implementation is not preferred. The invention herein may be utilized in a more complicated system, such as one which employs the phase control of the aforementioned U.S. Pat. No. 4,024,480. As shown herein, the SAW device 8 employs launching transducers 12, 14 disposed at opposite ends thereof, with the tap transducers 20-22 disposed therebetween. However, if desired, a configuration more like that illustrated in the aforementioned Reeder and Grudkowski patent may be employed, having both launching transducers at the same side of the tap transducers. Although only signal correlation and multiplexing have been described, it should be apparent after considering the teachings herein, in conjunction with any desired application, how the invention may be employed in a variety of other ways. The devices are shown herein in series with the load (output 40), but the load could be in parallel. The embodiment of FIG. 4 is obviously a special case of the embodiment of FIG. 3, since the more complex embodiments may be universally used in either the mixing or non-mixing fashion, thus having a more universal character.

Thus although the invention has been shown and described with respect to exemplary embodiments thereof, it should be obvious to those skilled in the art that the foregoing and various other changes, omissions and additions may be made therein and thereto, without departing from the spirit and the scope of the invention.

Having thus described typical embodiments of our invention, that which we claim as new and desire to secure by Letters Patent is:

1. A linear surface acoustic wave signal processing apparatus comprising:

a surface acoustic wave device formed on a piezoelectric substrate and having a plurality of acoustoelectric tap transducers and at least one other acoustoelectric transducer disposed thereon;

RF signal source means associated with at least said other transducer for launching at least one acoustic wave in said substrate in response to an RF signal related to the processing performed by said apparatus;

a plurality of circuit devices, each having a rectifying junction interconnected with a corresponding one of said tap transducers to form related output taps;

a plurality of DC bias means, each corresponding to a related one of said devices, each providing DC bias current in the rectifying junction of the corresponding one of said devices of a magnitude, related to a parameter involved in the signal processing performed by said apparatus, so as to provide RF output voltage from the related device as a linear function of the DC bias current; and means for combining RF currents from said devices to provide a combined RF output signal having a plurality of components each corresponding to one of said tap transducers and linearly related in amplitude to the DC bias current provided by the corresponding one of said DC bias means.

2. A linear surface acoustic wave signal processing apparatus according to claim 1 wherein said circuit devices comprise diodes.

3. A linear surface acoustic wave signal processing apparatus according to claim 1 wherein said circuit devices comprise transistors.

4. A linear surface acoustic wave signal processing apparatus according to claim 3 wherein said transistors comprise bipolar transistors.

5. A linear surface acoustic wave signal processing apparatus according to claim 1 wherein said substrate has an additional acoustoelectric transducer disposed thereon, and further comprising:

a second RF signal source means associated with said additional acoustoelectric transducer for launching a second acoustic wave in said substrate in response to a second RF signal related to the processing performed by said apparatus, and wherein the DC bias current provided by said DC bias means provides linear adjustment of the mixer efficiency of the nonlinear RF product mixing performed by the rectifying junction of the corresponding one of said devices.

6. A linear surface acoustic wave signal processing apparatus according to claim 5 wherein said circuit devices comprise diodes.

7. A linear surface acoustic wave signal processing apparatus according to claim 5 wherein said circuit devices comprise transistors.

8. A linear surface acoustic wave signal processing apparatus according to claim 7 wherein said transistors comprise bipolar transistors.

9. A linear surface acoustic wave signal processing apparatus according to claim 1 wherein said circuit devices comprise transistors and each of said tap transducers is responsive to a single acoustic wave in said substrate to provide an RF signal related to the processing performed by said apparatus for amplification in the related one of said transistors with a gain controlled by the DC bias current provided by the corresponding one of said DC bias means, whereby said transistors act as variable gain amplifiers, the gain of which is controlled by the respective ones of said DC bias means.

10. A linear surface acoustic wave signal processing apparatus according to claim 9 wherein said transistors comprise bipolar transistors.

* * * * *